United States Patent [19]
Bae

[11] Patent Number: 5,256,585
[45] Date of Patent: Oct. 26, 1993

[54] PROCESS FOR FABRICATING A GATE-DRAIN OVERLAPPED SEMICONDUCTOR

[75] Inventor: Dong-Joo Bae, Seoul, Rep. of Korea

[73] Assignee: SamSung Electronics Co., Ltd., Suwan, Rep. of Korea

[21] Appl. No.: 707,591

[22] Filed: May 30, 1991

[30] Foreign Application Priority Data

Apr. 10, 1991 [KR] Rep. of Korea ............... 1991-5708

[51] Int. Cl.⁵ .................................. H01L 21/336
[52] U.S. Cl. .................................. 437/44; 437/233
[58] Field of Search ............ 437/27, 28, 29, 30, 437/40, 41, 44, 203, 233, 235, 238

[56] References Cited

U.S. PATENT DOCUMENTS

| | | | |
|---|---|---|---|
| 4,466,172 | 8/1984 | Batra | 437/203 |
| 4,640,000 | 2/1987 | Sato | 437/203 |
| 4,859,630 | 8/1989 | Josquin | 437/203 |
| 4,944,682 | 7/1990 | Cronin et al. | 437/203 |
| 4,975,385 | 12/1990 | Beinglass et al. | 437/44 |
| 4,978,626 | 12/1990 | Poon et al. | 437/44 |
| 4,997,518 | 3/1991 | Madokoro | 437/203 |
| 5,015,599 | 5/1991 | Verhaar | 437/44 |
| 5,066,604 | 11/1991 | Chung et al. | 437/44 |
| 5,073,510 | 12/1991 | Kwon et al. | 437/44 |

Primary Examiner—Mary Wilczewski
Attorney, Agent, or Firm—Robert E. Bushnell

[57] ABSTRACT

Disclosed is a method for fabricating a MOS transistor of the GOLD structure that allows self-aligning contact process and more precise control of low-concentration diffusion regions. The method characteristically includes the steps of: forming an oxide layer(55) over the conductive electrode(53a,54a,58a), the thickness of the oxide layer being sufficiently greater than the gate oxide layer, and depositing an insulating interlayer(61) over the semiconductor substrate after forming source and drain regions, the insulating interlayer being directionally etched through a photoresist pattern, so as to form a contact hole having a width extended up to a partial portion of the conductive electrode. The effective channel widths of the low-concentration diffusion regions may be precisely controlled only by adjusting the thickness of polysilicon (or refractory metal or silicide thereof) layer selectively deposited on the side walls of the conductive electrode.

23 Claims, 5 Drawing Sheets

PROCESS FOR FABRICATING A GATE-DRAIN OVERLAPPED SEMICONDUCTOR

TECHNICAL BACKGROUND

The present invention relates to a process for fabricating a semiconductor device having a gate-drain overlapped device(GOLD) structure, in particularly a MOS transistor thereof.

Large-scale integration of semiconductor memory devices inevitably calls for an extremely critical design rule upon manufacturing of the unit semiconductor device, even up to sub-micron or less than 0.5 micron for a memory device of several or several tens of megabytes. Under such circumstance the reliability of a MOS transistor degrades and its punch-through voltage goes down, thereby involving the entire reconsideration of the operating voltage level and the structure applied thereto. In order to resolve this problem, there has been developed a drain-engineering method. The drain-engineering method employs DDD(Double Diffused Drain) structure having a drain doubly diffused with arsenic and phosphorous (as shown in vol. ED-30, pp 652–657, IEEE transaction of electron devices, 1983), or LDD (Lightly Doped Drain) structure having a drain and a source comprised of a doubly diffused region of a low doping-concentration region and high doping-concentration region (as shown in vol. ED-27, pp 1359–1367, IEEE TED, 1980). Both structures are used to prevent the degradation of the reliability of the semiconductor device. However, the disclosed structures have an inherent limitation in improving the reliability of the devices. This is partly because of the fact that the overlap length between the gate and the drain-source is an important parameter for control of the characteristics of such large-scale integrated devices.

In order to enhance the reliability of the semiconductor devices, there is disclosed a GOLD (gate-drain overlapped device) structure having a gate overlapped over a drain and a source, whose manufacturing method is published in pp 765–772, the articles 1 and 2 of IEDM, 89.

Referring to FIG. 1 illustrating the process for fabricating a conventional LDD type MOS transistor, the gate is an inverted T-shape. The conventional semiconductor devices has a P-well 1 and an N-well 2 for respectively forming an N-type and a P-type MOS transistor. A gate oxide layer 3, a field oxide layer 6 connected to a gate oxide layer 3, a polysilicon layer 4 and a low-temperature oxide(LTO) layer 5 are sequentially formed over the two wells, as shown in FIG. 1A. Contact holes 8, 9 are formed by using a photoresist pattern 7 deposited on the LTO layer 5. Thereafter the contact holes 8, 9 respectively are subjected to an ion-implantation of P-type and N-type impurities, as shown in FIG. 1B. After the ion-implantation, the contact holes 8 and 9 are filled with polysilicon to form polysilicon layers 12, 13. Then, is repeated a process that a selective ion-implantation process is carried out, after sequentially removing the photoresist pattern 7 and the LTO layer 5 and selectively depositing an oxide layer 16. Thereby the low-concentration sources and drains 14,15;17,18 of the NMOS and PMOS transistors are formed, as shown in FIG. 1C. Then the polysilicon layers 4, 12 are patterned to form the inverted T-shape gates 19, 21. Thereafter a thick LTO layer is deposited over the whole surface of the semiconductor substrate, and an etching process for forming gates having side wall oxide layers 20, 22, as shown in FIG. 1D. In this case the remainder of the LTO layer only in the side walls of the polysilicon gates 19, 21. Finally is repeated another process that a selective ion-implantation process is carried out by utilizing the gates comprised of the polysilicon gates 19, 21 and the side wall oxide layers 20, 22, after selectively depositing an oxide layer 25, thus the high-concentration sources and drains 23,24;26,27 of the NMOS and PMOS transistors are formed, as shown in FIG. 1D.

In the above conventional process, although the overlap widths of the low doping-concentration source and drain may be adjusted through controlling the sizes of the inverted T-shape polysilicon gates 19, 21 and side wall oxide layers 20, 22, an additional masking process is required to remove the remainder of the gate oxide layer 3 over the sources and drains in order to form the source/drain-contacts. Namely it is impossible to employ the self-align contact process that does not need an additional masking process.

In the field of fabricating semiconductor devices, it will be easily appreciated by one skilled in the art that the performance of the patterns without an additional masking process directly results in simplification of the processing steps and reduction the number thereof, thus inducing low-production cost.

FIG. 2 illustrates the conventional process of fabricating an LDD type MOS transistor as disclosed in the above article 2 of IEDM, 89. The gate is an oxide-sandwiched inverted T-shape. A poly gate 34 is formed, after sequentially depositing a gate oxide layer 31, a polysilicon layer 32, and an oxide layer 33 over the whole surface of a semiconductor substrate, as shown in FIG. 2A. Next, the impurities are ion-implanted and diffused to form a low-concentration source and drain 35, 36. A polysilicon layer 37 is deposited over the whole surface of the substrate, as shown in FIG. 2B, and covered with a thick dielectric layer (or oxide layer) 38 as shown in FIG. 2C. Then the polysilicon layer 37 and the thick dielectric layer 38 are subjected to an etching process to form a gate as shown in FIG. 2D, wherein the remainder of the thick dielectric layer 38 is only in the side walls of the polysilicon gate of inverted T-shape, and is served as oxide layer spacer 39. Thereafter the ion-implantation and thermal diffusion process are performed to form a high-concentration source and drain 40, 41.

In order to form a contact hole in the gate oxide layer 31 over the source and drain, an additional masking process is required like the method disclosed in the article 1. Namely the self-align process may not be applied to the contact process. Moreover, in the conventional processes illustrated in FIGS. 1 and 2, the overlap widths between the low-concentration source/drain and the inverted T-shaped polysilicon gate, are controlled by the widths of the wing portions (horizontal) of the inverted T-shaped gate and oxide spacer (or side wall oxide layer of FIG. 1) which are formed by etching process. Therefore, it is difficult to obtain a precise control of the overlap widths. For example, referring to FIG. 2, the gate-drain/source overlap widths of the low-concentration source and drain depend upon the process margin for the thickness of the polysilicon layer 37 deposited in the process of FIG. 2B and the process margin for the width of the oxide layer spacer 39 formed in the process of FIG. 2D. Thus the practically formed gate-drain/source overlap widths comprises undesirable error.

SUMMARY OF THE INVENTION

It is an object of the present invention to provide a method for fabricating a semiconductor device, which makes it possible to carry out self-align contact process without an additional masking process.

It is another object of the present invention to provide a method for fabricating a semiconductor device of the GOLD structure, which makes it possible to precisely control the overlap widths between the gate and diffusion regions.

It is still another object of the present invention to provide a method for fabricating a MOS transistor satisfying the high reliability and the large-scale integration of the semiconductor devices, through simple processes compared with the prior processes.

To achieve the objects according to the present invention, there is provided a method for fabricating a semiconductor device over a semiconductor substrate comprising the steps of: sequentially depositing first and second conductive layers over the semiconductor substrate, and thereafter coating an oxide layer on the second conductive layer, the thickness of the oxide layer being sufficiently greater than that of the gate oxide layer; subjecting to a first etching selected portions of the oxide layer and second conductive layer after forming a first photoresist pattern on the oxide layer; carrying out a first ion-implantation process with low-concentration impurities of the conductive type opposite to that of the semiconductor substrate, into the surface of the semiconductor substrate through the remainders of the oxide layer and second conductive layer served as the mask; selectively depositing a third conductive layer over the entire top surface of the semiconductor substrate except the top surface of the oxide layer subjected to the first etching; subjecting to a second etching selected portions of the first and third conductive layers so as to form a conductive electrode, the conductive electrode comprising the first, second and third conductive layers; carrying out a second ion-implantation with high-concentration impurities of the conductive type opposite to that of the semiconductor substrate, into the surface of the semiconductor substrate through the conductive electrode served as mask; depositing an insulating interlayer over the whole surface of the semiconductor substrate; and subjecting to a third etching the parts of the gate oxide layer, the insulating interlayer and a photoresist pattern after forming a second photoresist pattern on the insulating interlayer, so as to form a contact hole having a width extended up to the partial top surface over the conductive electrode, the contact hole exposing the top surface of the semiconductor substrate on the ion-implanted regions.

BRIEF DESCRIPTION OF THE DRAWINGS

The above and other objects, features and advantages of the invention will become more apparent from the following detailed description taken with the accompanying drawings, in which.

DETAILED DESCRIPTION OF A PREFERRED EMBODIMENT

Hereinafter, an example of the inventive process will now be described more specifically with reference to a MOS transistor of the GOLD structure, which may be applied to fabricate all kinds of semiconductor device.

Figure 1A:
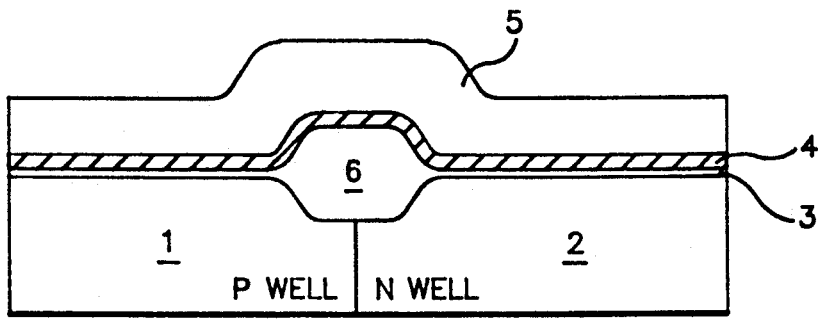
FIG. 1 illustrates the steps of a conventional process for fabricating a semiconductor device.
Figure 1B:
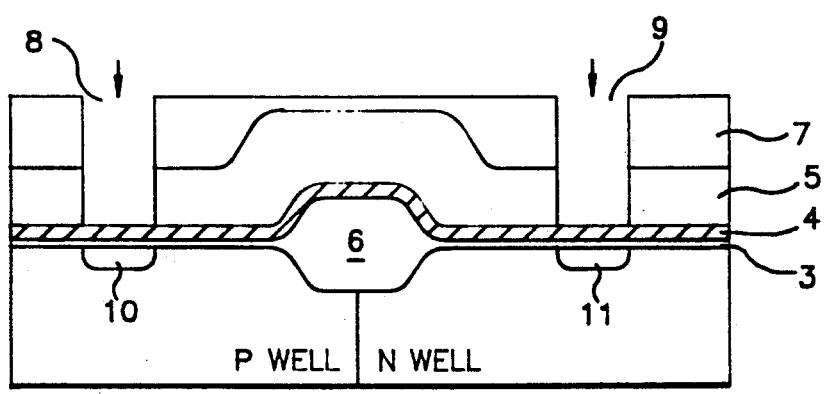
Figure 1C:
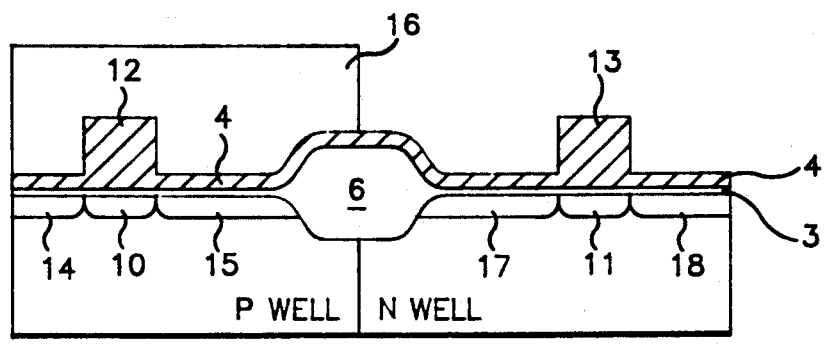
Figure 1D:
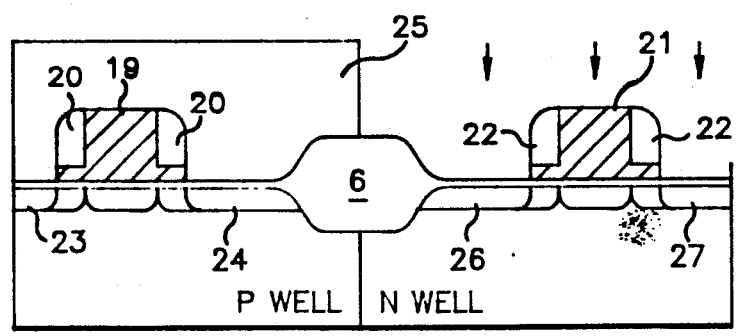
Figure 2A:
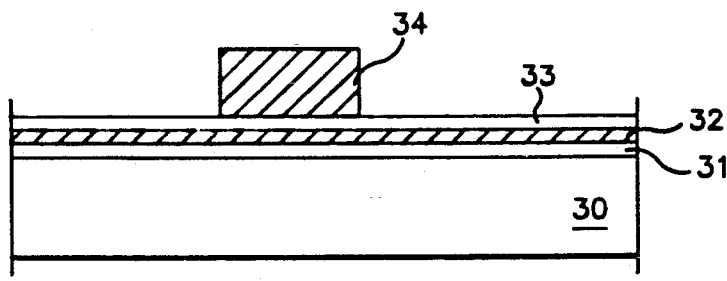
FIG. 2 illustrates the steps of another conventional process for fabricating a semiconductor device.
Figure 2B:
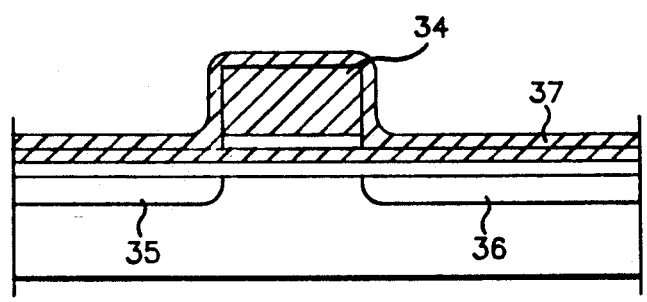
Figure 2C:
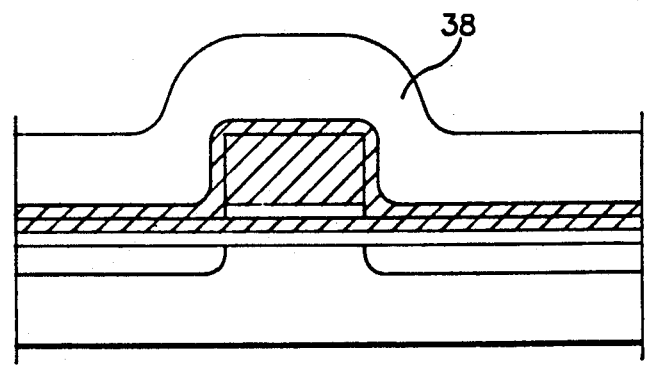
Figure 2D:
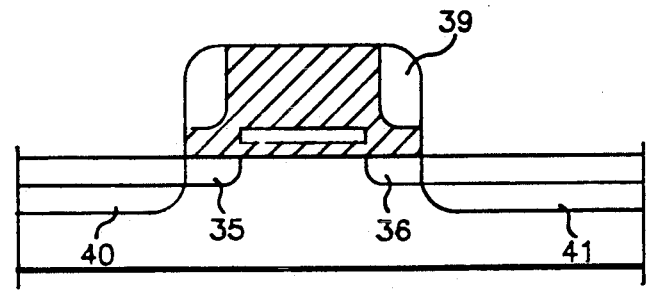

Referring to FIG. 3, a semiconductor substrate 50 has a field oxide layer 51 and gate oxide layer 52, and sequentially a gate polysilicon layer 53 of about 2000 Å, a refractory metal layer 54 of about 3000 Å and an oxide layer 55 of about 2000 Å, are deposited over the semiconductor substrate 50, as shown in FIG. 1A. The refractory metal may be tungsten (W), molybdenum (Mo) or titanium (Tx), or a silicide thereof. It should be noted that the thickness of the oxide layer 55 needs not to be restricted to 2000 Å, but need to be sufficiently thicker than that of the gate oxide layer 52.

Figure 3A:
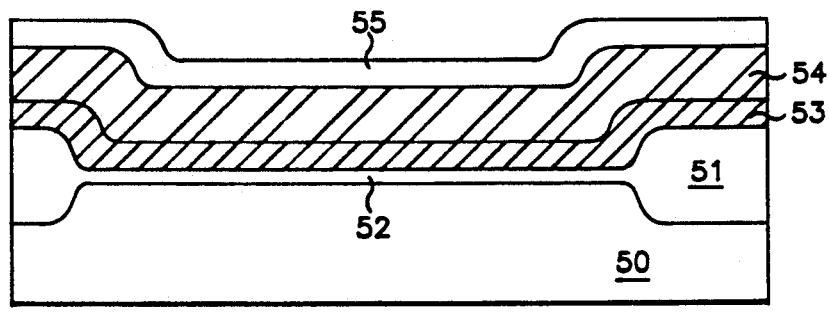
FIG. 3 illustrates the steps of the inventive process for fabricating a semiconductor device.
Figure 3B:
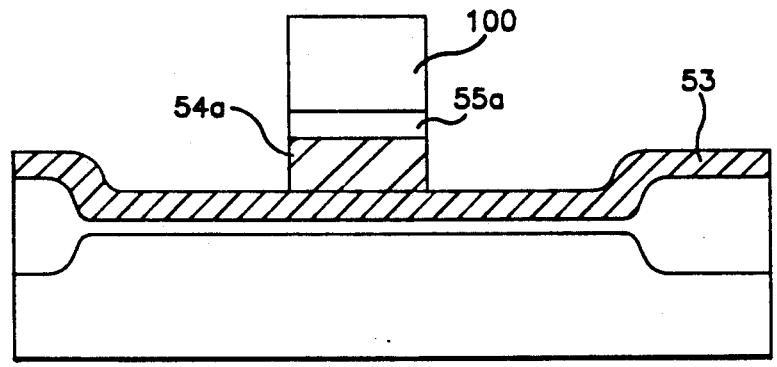

Next, a photolithography process is performed by using a photoresist pattern, to etch the refractory metal layer 54 and oxide layer 55 except the portions positioned over the channel region of the MOS transistor, until the partial top surface of the gate polysilicon 53 is exposed. Thereby a gate metal layer 54a and buffering oxide layer 55a are formed, as shown in FIG. 3B. Thereafter the photoresist pattern 100 is removed.

Figure 3C:
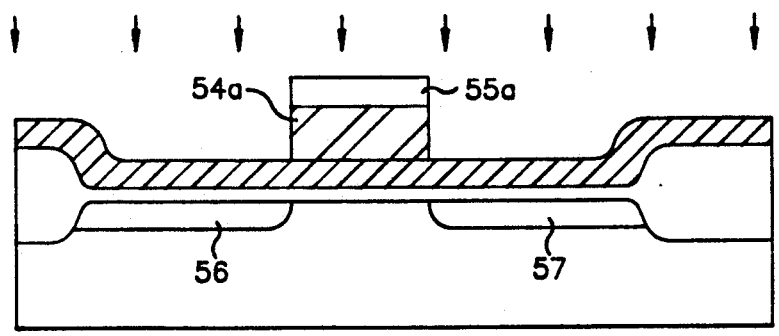

Referring to FIG. 3C, the gate metal layer 54a and buffering 55a serve as a mask in ion-implantation of N-type or P-type impurities (N-type impurities for P-type semiconductor substrate, or P-type impurities for N-type semiconductor), and above ion-implantation brings out the forming of the low-concentration source and drain regions 56,57. The dose of the ion-implanted impurities is as low as that of the concentration of the semiconductor substrate impurities. Also the energy required for the ion-implantation is satisfied with the degree that the ions go through the gate polysilicon layer 53 and gate oxide layer 52, to form ion-implanted regions adjacent to the semiconductor substrate, the ion-implanted regions being the low-concentration drain and source regions 56,57.

Then a polysilicon layer 58 of a polysilicon or a refractory metal or the silicide thereof is selectively deposited with a thickness of about 500–1000 Å by means of the chemical vapor deposition (CVD), over the whole surface of the substrate except the buffering oxide layer 55a. The thickness of the polysilicon layer 58 is the factor to determine the overlap widths between the gate and the low-concentration source and drain regions 56,57, and may be controlled in dependence upon the deposition rate per hour in a given condition. In the case of polysilicon, because the deposition rate is 150 Å/min at 85° C., the time taken for obtaining the thickness of 600 Å at the above temperature will be 4 minutes.

Figure 3D:
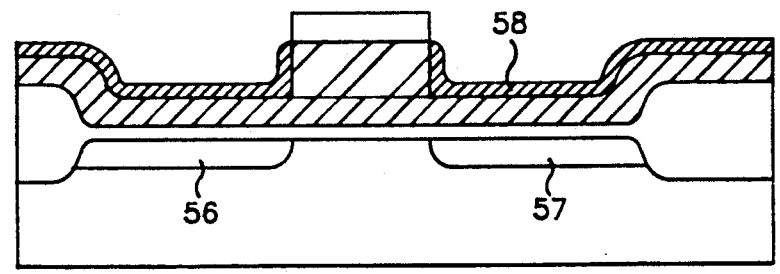
Figure 3E:
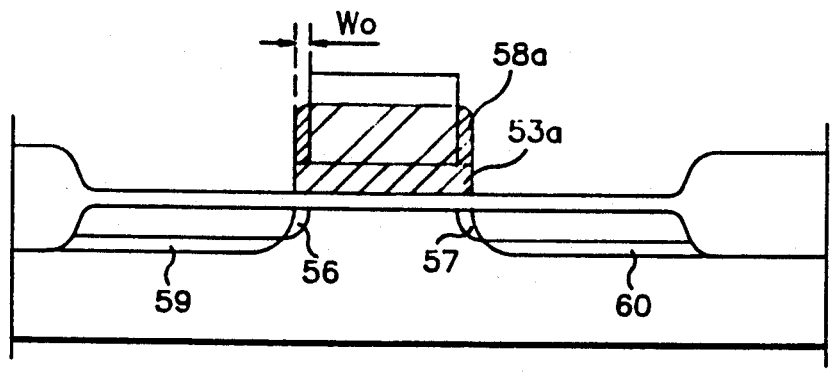
Figure 3F:
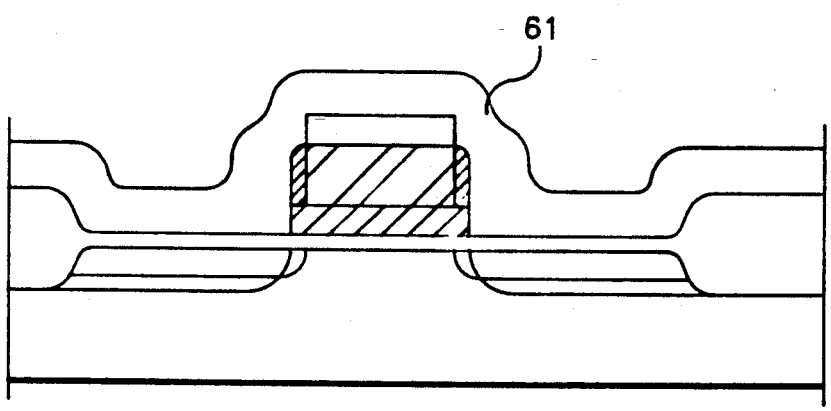

Referring to FIG. 3E, given portions of the polysilicon layer 58 and gate polysilicon layer 53 are selectively removed by etching, wherein the etching is carried out, except the portion combined with the etched refractory metal layer 54a and the overlap portion 58a, and the remainder 53a of gate polysilicon layer 53. The overlap portion having the overlap width $W_0$ between the gate and low-concentration drain and source. The overlap width $W_0$ is determined by the deposition thickness of the polysilicon layer 58, or refractory metal layer or silicide thereof layer, as shown in FIG. 3D. Thus the remainders 58a and 53a of the polysilicon layer 58 and gate polysilicon layer 53 respectively serve as a polysilicon spacer (or referred to as metal spacer in the case of using refractory metal, or silicide spacer for metal silicide) and polysilicon gate. A desired gate comprises the etched refractory metal layer 54a, the portion 58a formed on the both side walls of the refractory metal layer 54a, and the etched gate polysilicon layer 53a. This gate is used as a mask in ion-implantation of impurities with the high-concentration, so as to form the high-concentration source and drain regions 59,60. In this case, since the width of the upper portion of the gate is extended by the width $W_0$, the widths of the high-concentration source and drain regions 59,60 are less than those of the low-concentration source and drain regions 56,57. It is to be noted that the buffering oxide layer 55a formed in the process of FIG. 3B still remains. Thereafter an insulating interlayer 61 is deposited over the whole surface of the substrate, with the thickness about 2000 Å, as shown in FIG. 3F.

Figure 3G:
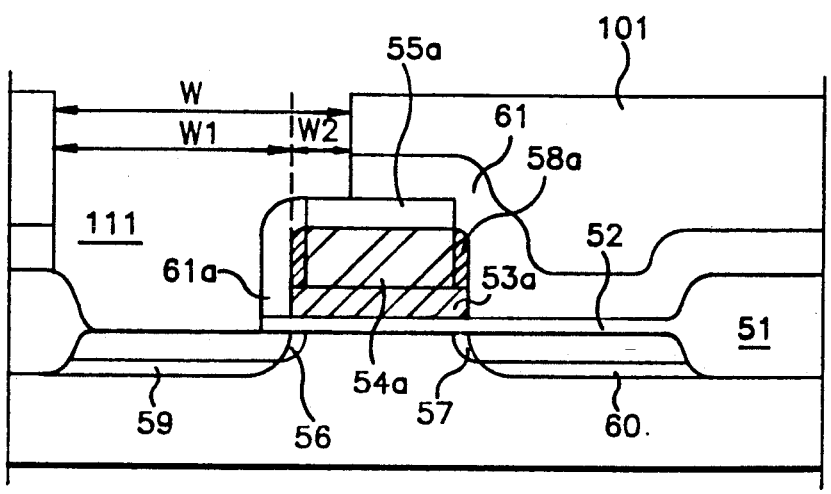

In order to contact the source and drain with metal, contact hole 111 is formed. Thus the source and drain of the MOS transistor are exposed through the self-aligning photoresist pattern 101 that may be only applied to the process according to the present invention, as shown in FIG. 3G. The contact hole 111 is extended up to a partial portion of the upper portion over the gate. Also the contact hole 111 is isolated from the gate by means of the remainder 61a of the insulating interlayer 61 and the buffering oxide layer 55a, the gate comprising the gate metal layer 54a, the polysilicon spacer 58a, and the polysilicon gate 53a. It will be readily appreciated by one skilled in this art that the insulating layer 61a remaining in the corners and side walls of the above gate is preserved in spite of the directional etching (or anisotropic etching) used in forming the contact hole 111.

Figure 4:
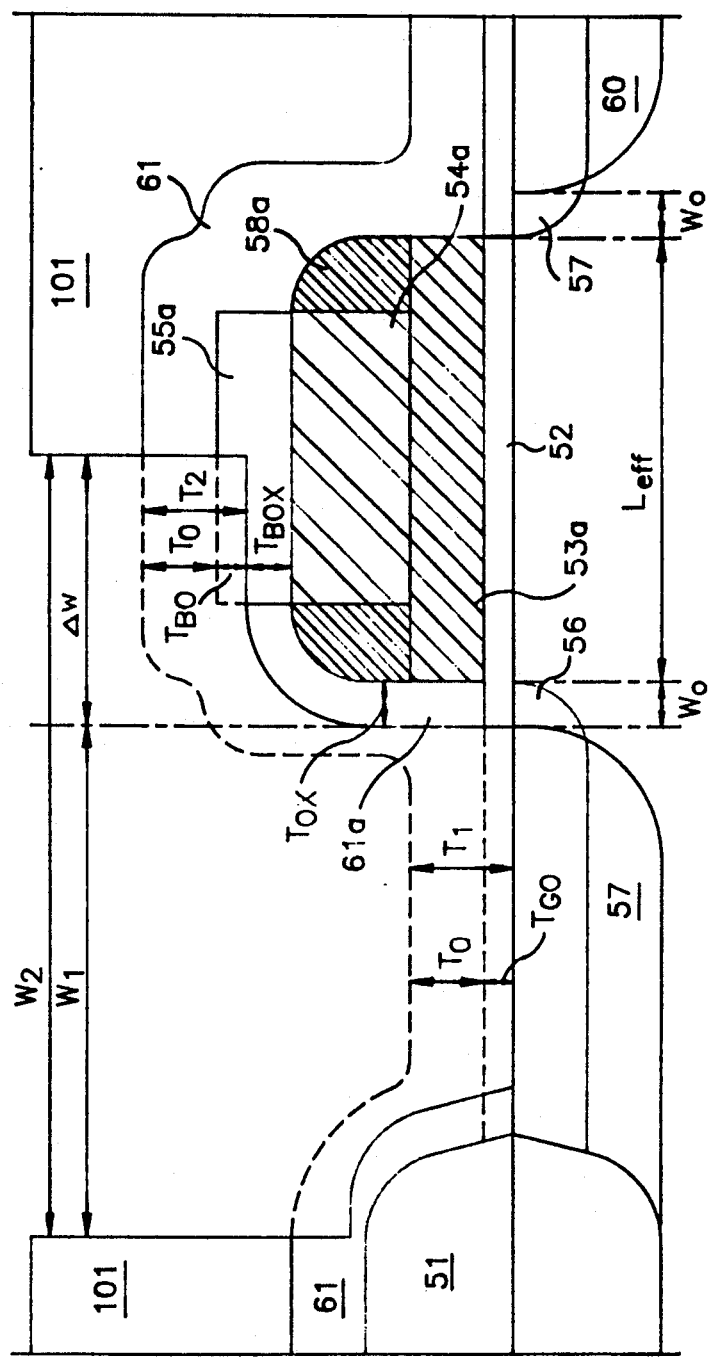
FIG. 4 is a cross sectional view for illustrating the structure of the contact hole formed according to the present invention.

Referring to FIG. 4, the portions indicated by dotted lines are removed through the directional etching, to form the contact hole 111. The insulating interlayer 61 and gate oxide layer 52 are sequentially etched by a combined thickness of about $T_1$, and simultaneously the partial portion of the buffering oxide layer 55a and insulating interlayer 61 are also etched by a combined thickness $T_2$. Of course, $T_1$ equals $T_2$, wherein $T_1$ (etched thickness of the region over the sources) = $T_0$ (etched thickness of the insulating interlayer 61) + $T_{GO}$ (etched thickness of the gate oxide layer 52), and $T_2$ ( etched the thickness of the region over the gate) = $T_0$ + - $T_{BO}$(etched thickness of the buffering oxide layer 55a). Thus the etched thickness $T_{BO}$ of the buffering oxide layer 55a equals the etched thickness $T_{GO}$ of the gate oxide layer 52. However, the thickness of the buffering oxide layer 55a is sufficiently greater than that of the gate oxide layer 52, so that the top surface of the gate is not exposed. Likewise, the thickness $T_{OX}$ of the remainder of the oxide layer 61a in the corners and side walls of the gate, isolates the above gate from the contact hole 111. Namely, although the width of the contact hole 111 is extended up to the upper portion over the gate, the thickness $T_{BOX}$ of the remainder of the buffering oxide layer 55a and the thickness $T_{OX}$ of the remainder of the insulating interlayer 61a prevent the gate from being contacted with the metal connected to the source region through the contact hole.

Consequently the conventional contacting process restricts the width of the contact hole to $W_1$, so as to isolate the gate from the metal, however the inventive process employs the self-aligning contact process so as to increase the width of the contact hole by $\Delta W$, i.e., to $W_2$. Thus it becomes possible to overcome the limitation of design rule required in designing the large-scale integration of the semiconductor devices. The widths $W_0$ of the low-concentration source and drain 56, 57 may be used to control the effective channel width $L_{eff}$ of the MOS transistor.

As stated above, because in the present invention, the self-aligning contact process is employed and the tolerance of the design rule of the high integrated semiconductor is increased, the present invention provides a method for fabricating the large-scale integration of the semiconductor devices of several tens of megabytes having the high reliability, with simple processes compared with the conventional processes. Also sub-threshold effect (undesirable effect of the channel current flowing below the threshold voltage) caused by the channel length of less 0.5 micron is prevented. Moreover, the present invention provides a highly reliable process for fabricating a MOS transistor of the GOLD structure, wherein the effective width between the low-concentration source and drain may be precisely adjusted only by controlling the deposition rate of polysilicon (or refractory metal or silicide thereof).

What is claimed is:

1. A method for fabricating a semiconductor device on a semiconductor substrate having a first oxide layer comprising a field oxide layer and a gate oxide layer, said method comprising the steps of:

sequentially depositing a first conductive layer and a second conductive layer and then forming a second oxide layer on said second conductive layer;

after forming said second oxide layer, performing a first etching of portions of said second oxide layer and said second conductive layer by forming a first photoresist pattern on said second oxide layer;

after said first etching, performing a first ion-implantation of impurities into first selected portions of a top surface of said semiconductor substrate by utilizing the remainder of said second oxide layer and the remainder of said second conductive layer as a mask;

after performing said first ion-implantation, selectively depositing a third conductive layer;

after depositing said third conductive layer, performing a second etching of portions of said first conductive layer and said third conductive layer to form electrode means comprising remaining portions of said first conductive layer, said second conductive layer and said third conductive layer;

after said second etching, performing a second ion-implantation of impurities into second selected portions of said top surface of said semiconductor substrate by utilizing said electrode means as a mask;

after said second ion-implantation, depositing an insulating interlayer over an entire surface of said semiconductor substrate; and after depositing said insulating interlayer, producing a contact hole by performing a third etching after forming a second photoresist pattern on said insulating interlayer.

2. A method for fabricating a semiconductor device as claimed in claim 1, wherein diffused regions in said semiconductor substrate exposed only to said first ion-implantation are low-concentration diffusion regions compared with diffused regions in said semiconductor substrate exposed to said second ion-implantation, said diffused regions exposed to said second ion-implantation being high-concentration diffusion regions.

3. A method for fabricating a semiconductor device as claimed in claim 2, wherein width of said high-concentration diffusion regions are less than widths of said low-concentration diffusion regions by a thickness of said third conductive layer.

4. A method for fabricating a semiconductor device as claimed in claim 1, wherein said third etching for forming said contact hole is a directional etching process so that only partial portions of said second oxide layer and insulating interlayer are removed.

5. A method for fabricating a semiconductor device as claimed in claim 1, further comprising forming a wiring contact to said ion-implanted regions through said contact hole.

6. A method for fabricating a semiconductor device as claimed in claim 1, wherein said contact hole is insulated from said electrode means by remaining portions of said second oxide layer and said insulating interlayer.

7. A method as claimed in claim 1, wherein producing said contact hole comprises directionally etching said insulating interlayer using said second photoresist pattern so as to form said contact hole therein, said contact hole having a width extended up to a partial top surface of said electrode means.

8. A method for forming a contact hole in a semiconductor device as claimed in claim 7, wherein said contact hole is insulated from said electrode by remaining portions of said protective oxide layer and said insulating interlayer.

9. A method for fabricating a semiconductor device as claimed in claim 1, wherein said semiconductor substrate has a first type conductivity and impurities implanted in said first ion-implantation have a second and opposite type conductivity.

10. A method for fabricating a semiconductor device as claimed in claim 1, wherein said third conductive layer is not deposited over said remainder of said second oxide layer.

11. A method for fabricating a semiconductor device as claimed in claim 1, wherein said third conductive layer is not deposited over a portion of said second oxide layer subjected to said first etching.

12. A method for fabricating a semiconductor device as claimed in claim 1, wherein said contact hole is electrically isolated from said electrode means by a remainder of said insulating interlayer remaining after said third etching.

13. A method for fabricating a semiconductor device as claimed in claim 1, wherein said contact hole has a width extending up to a partial top surface of said electrode means and exposing an ion-implanted portion of said semiconductor substrate.

14. A method for fabricating a semiconductor device as claimed in claim 1, wherein said first conductive layer is polysilicon.

15. A method for fabricating a semiconductor device as claimed in claim 1, wherein said second conductive layer is a refractory metal.

16. A method for fabricating a semiconductor device as claimed in claim 1, wherein said second conductive layer is silicide.

17. A method for fabricating a semiconductor device as claimed in claim 1, wherein said second conductive layer comprises one of tungsten, molybdenum, and titanium.

18. A method for fabricating a semiconductor device as claimed in claim 1, wherein said second conductive layer is formed directly on said first conductive layer.

19. A method for fabricating a semiconductor device as claimed in claim 1, wherein said semiconductor device is a gate-drain overlapped device.

20. A method for fabricating a semiconductor device as claimed in claim 1, wherein the thickness of said second oxide layer is greater than the thickness of said gate oxide layer.

21. A method for fabricating a semiconductor device as claimed in claim 1, wherein relative widths of said high-concentration regions and said low-concentration regions are controlled by a deposited thickness of said third conductive layer.

22. A method for fabricating a semiconductor device as claimed in claim 1, whereby the greater thickness of said protective oxide layer relative to said gate oxide layer insures that said contact hole is electrically isolated from said electrode means.

23. A method for fabricating a semiconductor device on a semiconductor substrate having a first oxide layer comprising a field oxide layer and a gate oxide layer, said method comprising the steps of:
sequentially depositing a first conductive layer and a second conductive layer and then forming a second oxide layer on said second conductive layer, a thickness of said second oxide layer being greater than a thickness of said gate oxide layer;
after forming said second oxide layer, performing a first etching of portions of said second oxide layer and said second conductive layer by forming a first photoresist pattern on said second oxide layer;
after said first etching, performing a first ion-implantation of impurities into first selected portions of a top surface of said semiconductor substrate by utilizing a remainder of said second oxide layer and a remainder of said conductive layer as a mask;
after performing said first ion-implantation, selectively depositing a third conductive layer over an entire top surface of said semiconductor substrate except for a top surface of said second oxide layer;
after depositing said third conductive layer, performing a second etching of portions of said first conductive layer and said third conductive layer to form an electrode comprising remaining said portions of said conductive layer, said second conductive layer and said third conductive layer;
after said second etching performing a second ion-implantation of impurities into second selected portions of said top surface of said semiconductor substrate by utilizing said electrode as a mask;
after said second ion-implantation, depositing an insulating interlayer over an entire surface of said semiconductor substrate; and
after depositing said insulating interlayer, producing a contact hole by performing a third etching after forming a second photoresist pattern on said insulating interlayer, said contact hole having a width extending up to a partial top surface of said electrode and exposing an ion-implanted portion of said semiconductor substrate.

* * * * *

UNITED STATES PATENT AND TRADEMARK OFFICE
CERTIFICATE OF CORRECTION

PATENT NO. : 5,256,585
DATED : October 26, 1993
INVENTOR(S) : Dong-Joo Bae

It is certified that error appears in the above-indentified patent and that said Letters Patent is hereby corrected as shown below:

On the Title page, item [54], and col. 1, line 2, insert --DEVICE-- after "SEMICONDUCTOR".

Column 7, line 32, insert --means-- after "electrode";
Column 7, line 33, change "protective" to --second--;
Column 8, line 53, insert --,-- after "etching".

Signed and Sealed this

Fifth Day of April, 1994

Attest:

BRUCE LEHMAN

*Attesting Officer*    *Commissioner of Patents and Trademarks*